United States Patent
Jedema et al.

(10) Patent No.: US 7,791,059 B2
(45) Date of Patent: Sep. 7, 2010

(54) ELECTRIC DEVICE WITH PHASE CHANGE RESISTOR

(75) Inventors: Frisco J. M. Jedema, Eindhoven (NL); Karen Attenborough, Hechtel-Eksel (BE); Roel Daamen, Melick (NL); Michael A. A. In 'T Zandt, Veldhoven (NL)

(73) Assignee: NXP B.V., Eindhoven (NL)

( * ) Notice: Subject to any disclaimer, the term of this patent is extended or adjusted under 35 U.S.C. 154(b) by 72 days.

(21) Appl. No.: 12/294,020

(22) PCT Filed: Mar. 21, 2007

(86) PCT No.: PCT/IB2007/050995
§ 371 (c)(1),
(2), (4) Date: Sep. 22, 2008

(87) PCT Pub. No.: WO2007/110815
PCT Pub. Date: Oct. 4, 2007

(65) Prior Publication Data
US 2009/0127537 A1 May 21, 2009

(30) Foreign Application Priority Data
Mar. 24, 2006 (EP) .................................. 06111698

(51) Int. Cl.
*H01L 47/00* (2006.01)
(52) U.S. Cl. .................................. 257/3; 257/E45.002
(58) Field of Classification Search .................. 257/2–5, 257/E45.002
See application file for complete search history.

(56) References Cited

U.S. PATENT DOCUMENTS

| 5,933,365 | A | | 8/1999 | Klersy |
| 6,086,990 | A | * | 7/2000 | Sumino et al. .............. 428/336 |
| 6,815,704 | B1 | | 11/2004 | Chen |
| 7,214,958 | B2 | * | 5/2007 | Happ ............................. 257/4 |
| 7,488,968 | B2 | * | 2/2009 | Lee ............................... 257/4 |
| 2005/0056937 | A1 | | 3/2005 | Frank |

FOREIGN PATENT DOCUMENTS

CN 1545152 A 10/2004

(Continued)

OTHER PUBLICATIONS

Gosset L G, et al; "General Review of Issues and Perspectives for Advanced Copper Interconnections Using Air Gap As Ultra-Low K Material"; Pitscataway, NJ, USA; IEEE, Jun. 2, 2003, p. 65-67; XP010650019; ISBN: 0-7803-7797-4.

Pirovano A et al; "Electronic Switching Effect and Phase-Change Transition in Chalcogenide Materials"; IEDM Tech. Dig. 923-926 (2002).

(Continued)

*Primary Examiner*—Mark Prenty

(57) ABSTRACT

An electric device has an electrically switchable resistor (2') comprising a phase change material. The resistance value of the resistor can be changed between at least two values by changing the phase of the phase change material within a part of the resistor called the switching zone (12') using Joule heating of the resistor. The device comprises a body (24') encapsulating the resistor, which body comprises at least two abutting regions (26', 28') having different thermally insulating properties. These regions form a thermally insulating contrast with which the dimension of the switching zone can be determined without having to alter the dimensions of the resistor. Such a device can be used in electronic memory or reconfigurable logic circuits.

8 Claims, 9 Drawing Sheets

FOREIGN PATENT DOCUMENTS

| | | | |
|---|---|---|---|
| KR | 2003080843 | A | 10/2003 |
| WO | 98/58385 | A | 12/1998 |
| WO | 2004/034482 | A2 | 4/2004 |
| WO | 2004/057618 | A2 | 8/2004 |
| WO | 2004/057684 | A1 | 8/2004 |
| WO | 2005/027134 | A1 | 3/2005 |
| WO | 2005/041196 | A1 | 6/2005 |
| WO | 2006/035325 | A1 | 6/2006 |

OTHER PUBLICATIONS

Delan, A, et al, Thermal Conductivity of Ultra Low-K Dielectrics; Microelectronic Engineering 70 (2003), 280-284.
Journal of Applied Physics 81 (1997), 2590.
Journal of Electronic Material, 2005, p. 176.
Journal of Applied Physics 85 (1999), 7130.
Costescu, R.M. et al; Science 303, Ultra-Low Thermal Conductivity in WAl2O3 Nanolaminates; 2004, p. 989-990.

* cited by examiner

ELECTRIC DEVICE WITH PHASE CHANGE RESISTOR

The present invention relates to an electric device comprising an electrically switchable resistor comprising a phase change material, the resistor being electrically connected to a first and second electrical contact via a first and second contact area, the resistor extending between the first and second contact area and having a length, defined as the distance between the first and second contact area measured along the resistor, the device further comprising a body located around the resistor in between the first and second contact area, the body being in thermal contact with the resistor.

The invention further relates to an electric circuit comprising the electric device.

Such a device can be applied in an electronic apparatus comprising for example (re)-configurable logic or (re)-programmable non-volatile memory.

WO2005041196 A1 discloses an electric device comprising a memory material layer consisting of a phase change material and first and second electrical contacts that are located at a distance from one another, via which a switching zone of the memory material layer is traversed by a current signal. The current signal can be used to induce a phase change between a crystalline and an amorphous phase, and therewith a change in resistance of the phase-change material in the switching zone.

During the current signal Joule heating of the phase change material occurs, which causes that the temperature increases to such an extent within a part of the phase change layer, called "switching zone", that the phase of the material can change. Specifically, when the temperature of a crystalline part rises above the melting temperature, it becomes amorphous, while heating of an amorphous part to temperatures between the crystallization temperature and the melting temperature, results in its crystallization. The phases are persistent in time, even after power shutdown.

When all the phase change material within the phase change layer is crystalline, the resistance of the layer is relatively low since the resistivity of the crystalline phase change material is relatively low. This situation is referred to as the "SET" state of the memory. When the phase change material within the switching zone of such a crystalline layer is in the amorphous phase, which has a higher resistivity than the crystalline phase, the resistance is relatively high. This defines the "RESET" state of the memory. The switchable or dynamic resistance, as defined by the difference between the resistances of the RESET and the SET state, is determined by change of the resistance of the switching zone upon switching.

In one embodiment of the known device, the current signals, used to induce a change from the crystalline to the amorphous phase ("RESET signal"), or vice versa ("SET signal"), are provided by a transistor. For integration of the resistor into an efficiently operating device, the resistance values of its different states must be matched to those of the transistor, or any other switching or selection device or circuit. Therefore, it is desirable that the resistance values of the resistor can be independently tailored.

It is a problem of the known device that the resistances of the different states are difficult to tailor independently in a reliable way.

It is an object of the present invention to provide a device of the kind described in the opening paragraph, for which the resistances of the different states can be independently tailored in a reliable way. The invention is defined by the independent claims. The dependent claims define advantageous embodiments.

The object is realized in that the electric device as specified in the opening paragraph is adapted such that, along the resistor in the direction of its length and between the first contact area and the second contact area, the body successively comprises a first region and a second region, the first and second regions defining a first contact surface extending between the first and the second region, the contact surface comprising a first portion which has a first angle of inclination with respect to the length direction of the resistor, the first region having a first material composition and the second region having a second material composition different from the first material composition, such that the first and second regions have different thermally insulating properties.

The invention is based on the recognition that a thermal contrast can be created within a body which surrounds the resistor and is in thermal contact with the resistor, such that it controls a dimension of the switching zone.

The body extends into the surroundings of the resistor between the first and second contact and, perpendicular to the length direction of the resistor, from the surface of the resistor to within a distance smaller than the distance that heat, generated within the resistor, penetrates into the surroundings. Hence, the body is in thermal contact with the resistor.

The term "thermal contrast" refers to a structure within the body which causes that the thermally insulating properties of the body alongside the resistor differ along the resistor in the length direction. The term 'thermally insulating properties' is meant to include at least one of the parameters which influences thermal insulation of materials according to general knowledge. Such parameters include for example: specific heat capacity and/or thermal conductivity. The structure within the body is formed by the first and second region, which are positioned adjacent to each other, such that they have a mutual first contact surface of which a first portion has an angle of inclination with respect to the length direction of the resistor and which angle of inclination is different from 0° or 180°. Since the first and second region have different thermal properties, the body comprises a thermal contrast alongside the resistor at the position of the inclined portion of the first contact surface.

During a heating event, the thermal contrast results therein that heat, generated at different positions along the resistor in its length direction, flows into and through the body with different speeds. Therewith, the body provides different cooling at different positions along the resistor in its length direction and influences the temperature distribution within the resistor along this length direction. Thus, after application of an appropriate amorphizing current signal to the resistor, a transition region between crystalline and amorphous phase change material forms within the resistor alongside the location of the thermal contrast. This transition region extending over a length interval represents a cross sectional boundary surface of a switching zone.

Thus, by tailoring the position of one or more cross sectional boundary surfaces, the length of a switching zone can be controlled. This advantageously provides control over the dynamic resistance and therewith allows that the resistances of the RESET and SET state can be independently designed and obtained. This is further elucidated in the described embodiments of the present invention.

It is an additional advantage that the independent control over the resistances is gained without having to perform complex adjustment of the composition of the phase change material. Besides resistivities of the different phases, a number of other parameters also depend on this composition. Such parameters include for example: switching speed, stability of the amorphous phase, and chemical compatibility with other device materials. Thus, the present invention reduces the need for complex, expensive, time consuming material adjustment. Moreover, it increases the freedom of choice of phase change materials.

It is a further advantage of the invention that the threshold voltage for switching from the RESET to the SET state can be controlled. The threshold voltage defines an upper boundary of the voltage range wherein the resistor can conduct current without a change of state occurring due to a phase change. It is described by A. Pirovano et. al., in IEEE 2002, A. Pirovano, A. L. Lacaita, D. Merlani, A. Benvenuti, F. Pellizzer and R. Bez in, IEDM Tech. Dig., 923-926 (2002) that the threshold voltage depends on the RESET state resistance.

The threshold voltage is preferably lower than the supply voltage, available within an electrical apparatus or integrated circuit (IC) that comprises the device. If not, switching is either hampered or costly and complex additional measures are needed to supply the higher voltage.

The thermal contrast can be advantageously adjusted by design of the geometric structure and/or the choice of the materials compositions of the first and second regions. Furthermore, this adjustment can be done with conventional semiconductor manufacturing techniques, which for example facilitates the integration of the present invention in existing semiconductor manufacturing process flows.

A first embodiment of the device according to the present invention is defined as specified in claim 2. In the case that the value of the first angle of inclination between the first portion of this first contact surface and the length direction of the resistor is between 60° and 120°, the thermal contrast, is relatively sharp. This causes that a cross sectional boundary surface of the switching zone forms as a relatively thin transition region. The thinner this transition region is, the better the position of the boundary surface is defined along the length direction and the more precise is the control over the dynamic resistance. A sharper contrast is thus also advantageous in case of multiple cross sectional boundary surfaces, especially when the resistor is short. A further advantage is that the dynamic resistance is less sensitive to variations in switching signal enhancing reliability of the device. This is due to the fact that the temperature distribution within a transition region is steeper so that the position of a cross sectional boundary surface is less dependent on the temperature.

An embodiment of a device according to the present invention is defined as specified in claim 3. In this embodiment, the device comprises a second contact surface formed between the third and fourth region. This second contact surface is of the same kind as the first contact surface and its second portion, which has a second angle of inclination with the length direction of the resistor creates a second thermal contrast within the body alongside the resistor. All advantages described for the first thermal contact apply equally well to the second one. However, since the second thermal contrast may be tailored substantially independently from the first thermal contrast, control over an extra cross-sectional boundary surface of the switching zone is enabled. This advantageously results in increased freedom for confining the switching zone. For example, when the resistor has a shape or composition that is not constant along its length, the dynamic resistance is dependent on the position of the switching zone. Furthermore, the cross sectional boundary surfaces can be kept at a distance from the first and second contacts and their direct surroundings, therewith enabling a reduction of switching power, since these contacts generally act as heat sinks.

In one variation of this embodiment, the first and fourth regions have the same material composition and the second and third regions have the same materials composition. In this arrangement, the second region forms a protrusion in the first region having contact surfaces on each of its sides and inclined with the length direction of the resistor. The advantages of having only two such regions are simpler design and manufacture.

An embodiment of a device according to the present invention is defined as specified in claim 4. The substantially parallel further portion does not form a thermal contrast. Thus, the temperature gradient within a part of a resistor alongside the further portion is relatively small, i.e. the temperature within the resistor will not significantly differ alongside this portion. In case the further portion is relatively long, the temperature within the adjacent part of the resistor may even be substantially constant along a portion of its length. Such temperature distributions within the switching zone advantageously reduce unwanted hotspots and give controlled phase change or switching dynamics, therewith increasing reliability and lifetime of the device.

An embodiment of the device according to the present invention is defined as specified in claim 6. The auxiliary region physically separates the resistor, at least partly, from the body and it may serve several purposes with their specific advantages. Firstly, it may have a materials composition such that it promotes adhesion between the materials of the body and the resistor, therewith enhancing integrity of the device. Secondly, it may protect the resistor from contamination with materials components present in the body and/or vice versa. This auxiliary region enables that materials that are incompatible with the resistor when in direct contact with the resistor, can be used for the construction of the thermal contrast within the body. Thirdly, it may form a barrier layer reducing out-diffusion or out-gassing of (vital) materials components of the resistor during operation. It therewith enhances the device operating reliability and/or lifetime. Fourthly, the auxiliary region may be formed of a material that enhances mechanical or thermal-mechanical stability. This can be advantageous when one of the contrasting regions comprises a void which is vacuum or filled with gas or liquid.

An embodiment of the device according to the present invention is defined as specified in claim 7. In case the smallest cross section is rectangular, its smallest dimension is the length of its shortest side. Alternatively, when the smallest cross section is substantially round, oval, or circular, its smallest dimension is its smallest radius. The switching zone has a lateral boundary surface, which extends substantially along the resistor in its length direction. It may be predominantly parallel to or even partly or entirely coincide with the resistors surface. In this embodiment, the lateral boundary surface is larger than the total area of the cross sectional boundary surfaces. Therefore, during a switching or heating event, more heat flows through the lateral boundary surface into the body than through the cross sectional boundary surfaces. This increases the effect of the thermal contrast.

An embodiment of the device according to the present invention is defined as specified in claim 8. A nanowire has a relatively small diameter and is relatively long with respect to its cross sectional dimensions. Therewith, and according to the previously described embodiment, the thermal contrast of the body is particularly effective. Due to the small cross section, the cross sectional boundary surfaces are relatively thin, i.e. they extend over a relatively short length interval.

An embodiment of the device according to the present invention is defined as specified in claim 9. Within the constriction, the current density is higher than elsewhere in the resistor. Thus, most heat is generated within the constriction and its location and shape may be advantageously predetermined such that it cooperates with the thermal contrast of the body enhancing its effect on the switching zone confinement or definition.

An embodiment of the device according to the present invention is defined as specified in claim 10. When deposition of layers during manufacturing takes place parallel to the surface of the substrate, the dimension of the contrasting regions in the length direction and hence the length of the switching zone can be adjusted with layer thickness. Layer thickness control is generally very accurate and may be down to a few atomic layers, advantageously enabling the control over relatively short switching zones. Furthermore, surface roughness of the layers can generally also be controlled relatively well. This enables formation of better contact surfaces enhancing the sharpness of the thermal contrasts accompanied by all its advantages for the dynamic resistance control. A further advantage of a vertically arranged resistor, is that it requires less space than a horizontally arranged one, thus allowing increased device integration density.

An embodiment of the device according to the present invention is defined as specified in claim 11. Vacuum or gasses possess relatively good thermally insulating properties. Thus, combining a region comprising a gas or vacuum with a region having relatively less good thermally insulating properties to form a contact surface, provides a relatively good thermal contrast from a materials point of view. Furthermore, the relatively good thermal isolation advantageously results in low switching currents or powers. Moreover, it may reduce heat cross-talk between neighboring devices in for example high density integration schemes.

An embodiment of the device according to the present invention is defined as specified in claim 12. In order to tailor the thermal contrast in the body, the ratio of the thermal conductivities of two material compositions of two regions forming a thermal contrast as described here above may be chosen. In one variation of this embodiment the ratio is larger than 5. A better contrast is obtained with a ration larger than 10 or 20. Preferably the ratio is larger than 30 or 40.

A first embodiment of an electrical apparatus according to the present invention is defined as specified in claim 13. Such an apparatus can be used as an electrical non-volatile memory. Each memory cell may comprise a selection device, allowing that individual memory elements can be conveniently independently selected for determination or setting of the state of the resistor.

A second embodiment of an electrical apparatus according to the invention is defined as specified in claim 14. Such an apparatus may function as a re-configurable or re-programmable logic apparatus. In this respect it is advantageous that the state of the switch is remnant, meaning that it persists after power shutdown. The sate of the switch may be changed during operation of the device. Therewith, the function of the apparatus may be altered during operation.

It is noted that a memory element with an energy control mechanism is known as such from U.S. Pat. No. 5,933,365. Herein it is described that to achieve a more efficient use of the energy available for programming of the memory material, the memory element comprises thermal isolation means for controlling the transfer of heat energy out of at least a portion of the memory material. In one embodiment of the device two thermal isolation layers partially encapsulating the memory material are used to fulfill this goal. However, in this document it is not disclosed how to create and use a thermal contrast as described in the present invention.

A phase change memory device employing thermally insulating voids is known as such from U.S. Pat. No. 6,815,704 B1. In this known device, the voids are formed into the spacer material in order to impede heat from the phase change material from conducting through the insulating material. In the known device the void is used to reduce the volume of memory material programmed to reduce the required switching power. However, the preparation and use of a thermal contrast as described in the present invention is not disclosed.

From the document US 2005/0056937 A1 a connection device is known, which includes a plurality of re-configurable phase change vias, which connect the first metal layer to a second metal layer. A heating element is disposed between the first metal layer and that the second metal layer. The heating element provides an actuating element for resistive heating of the re-configurable phase change vias to change their conductivity. The document does not provide any indication on how to control the resistance of the via in the non-conductive state.

These the and other aspects of the invention will be further elucidated and described with reference to the drawings in which:

FIG. 1 schematically shows a cross-section of an embodiment of a device according to the prior art, viewed perpendicular to the length direction of the resistor.

FIG. 2 schematically shows a cross section of an embodiment of a device according to the invention, viewed perpendicular to the length direction of the resistor.

FIGS. 3, 4 and 5 schematically show cross sections of a number of embodiments of the device according to the invention, viewed perpendicular to the length direction of the resistor.

Figure 8:
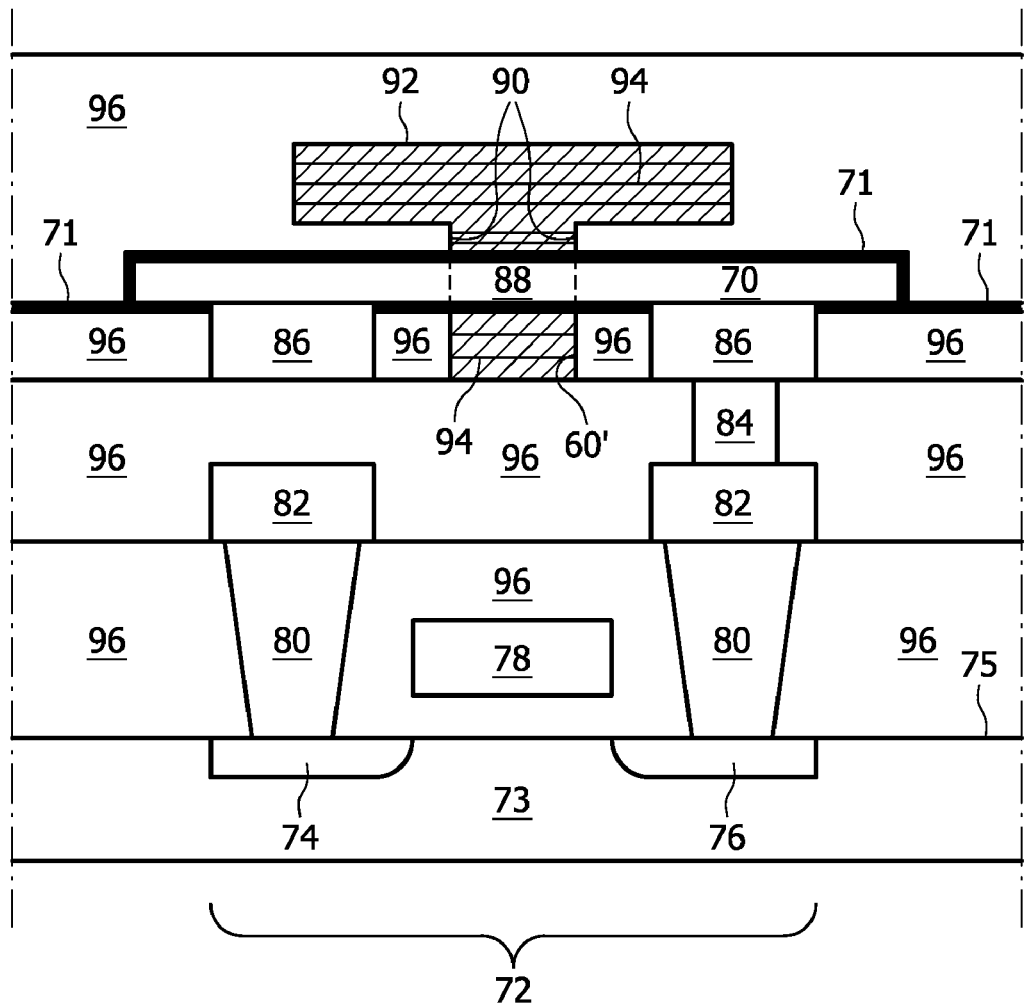

FIG. 8 schematically shows a part of a cross section of an embodiment of a device according to the invention in which a horizontal resistor is electrically connected to a transistor.

Figure 9:
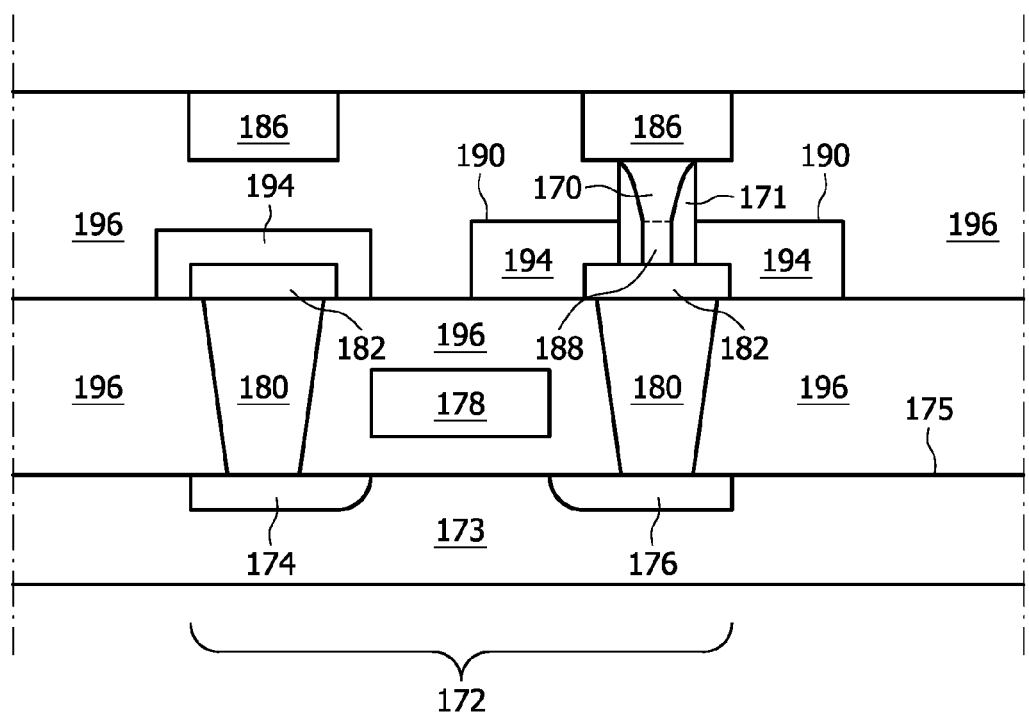

FIG. 9 schematically shows a part of a cross section of an embodiment of a device according to the invention in which a vertical resistor is electrically connected to a transistor.

Figure 10:
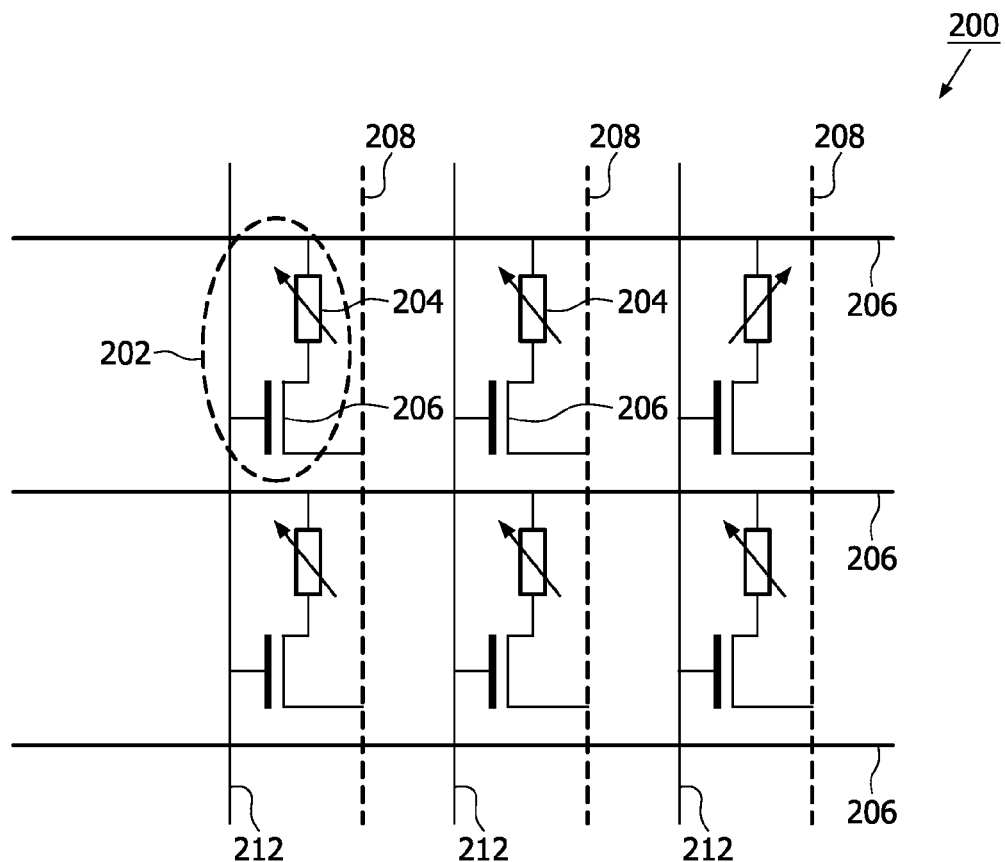

FIG. 10 is a schematic electrical connectivity scheme of a memory apparatus according to the invention.

Figure 11:
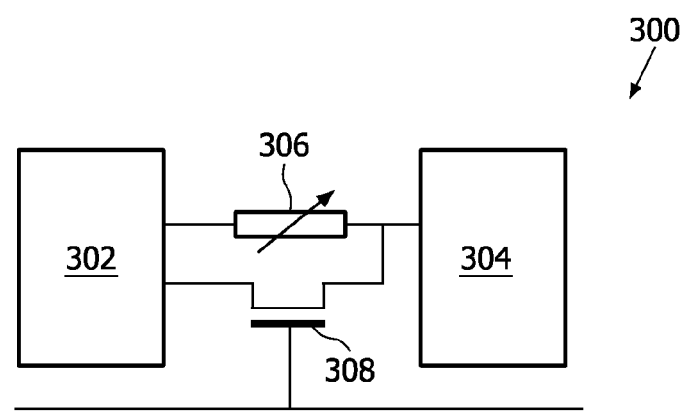

FIG. 11 is a schematic electrical connectivity scheme of a re-configurable or programmable logic apparatus according to the invention.

Figure 1:
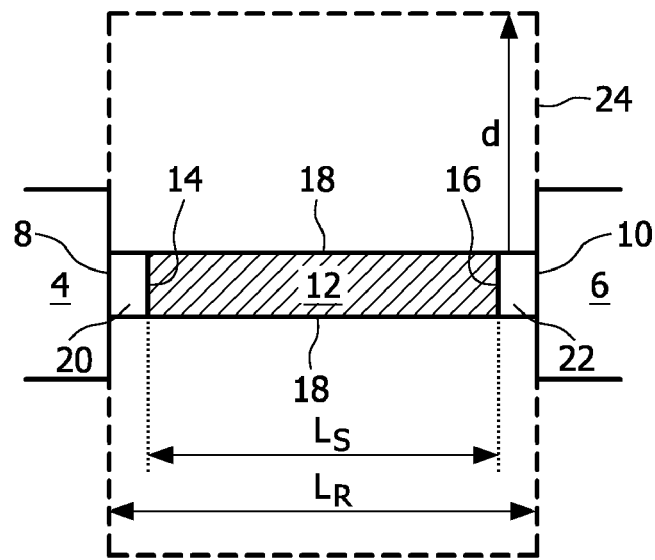
Figure 2:
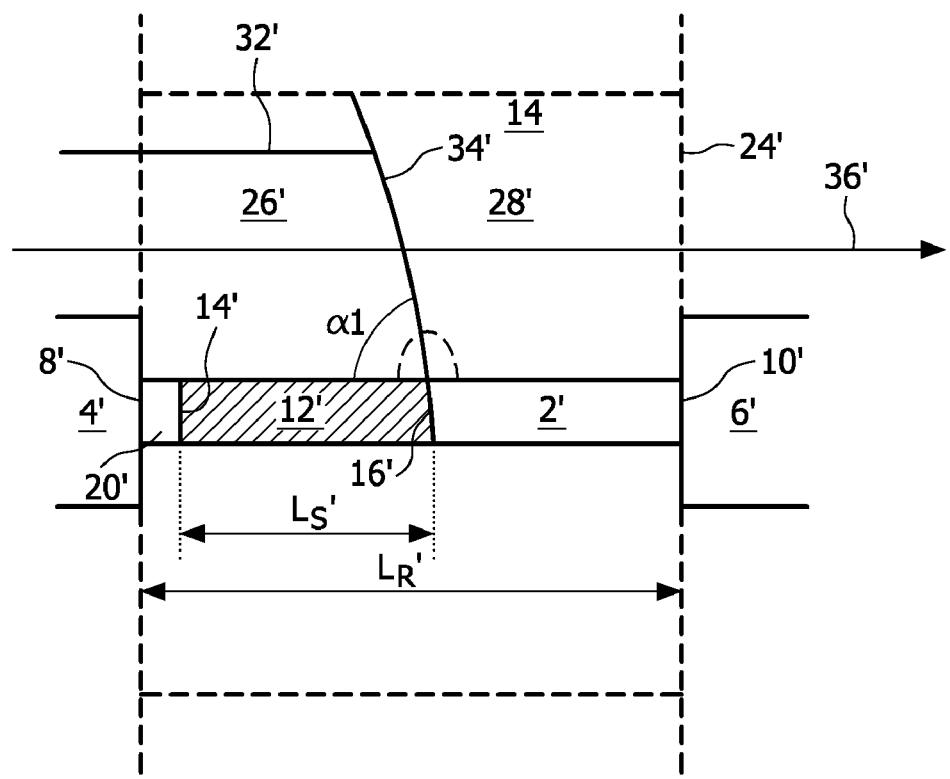

The present invention is explained using FIGS. 1 and 2, which schematically show two cross sections of a device comprising identical resistors 2 (2'), but different surroundings of the resistor. While the device depicted in FIG. 1 represents prior art, that of FIG. 2 represents an embodiment of a device according to the present invention.

Each resistor comprising phase change material can have two or more states with different resistance values originating from the properties of the phase change material and its relative amount in the resistor. This material can reside in an amorphous phase, having a relatively high electrical resistivity $\rho_{amorph}$, or a crystalline phase having a relatively low electrical resistivity $\rho_{cryst}$. However, in the examples shown in FIGS. 1 and 2 the resistor 2 (2') is presumed to be entirely made of phase change material having only the two phases. Therefore, the resistor 2 (2') is able to be in a SET state with relatively low electrical resistance or a RESET state having relatively high electrical resistance.

In both devices, the resistor 2 (2') extends between a first electrode 4 (4') and a second electrode 6 (6'), both electrically connected to the resistor via a first electrical contact area 8 (8') and a second electrical contact area 10 (10'). The resistor 2 (2') has a length $L_R$ ($L_R'$) measured from the first contact area 8 (8') to the second contact area 10 (10') along the resistor. The length $L_R$ ($L_R'$) is measured in the direction of current flow through the resistor. The resistor 2 (2') further comprises a switching zone 12 (12'), which represents the volume or portion of the resistor wherein the phase of the phase change material changes when an appropriate current signal is applied to the resistor via the electrodes 4 (4') and 6 (6'). The switching zone 12 (12') has cross-sectional boundary surfaces 14 (14') and 16 (16') having areas $A_C$, as well as a lateral boundary surfaces 18 (18') having an area $A_L$, which together enclose the entire switching zone. The switching zone 12 (12') extends in the length direction over a length $L_s$ ($L_s'$) between the cross-sectional boundary surfaces 14 (14') and 16 (16').

The devices shown are symmetric around the length direction. Their cross sections are constant along the length direction, such that the cross-sectional boundary surfaces 14, (14') and 16 (16') are also constant along this direction. It is further presumed that the lateral boundary surfaces 18 and (18') coincide with the surfaces of the resistor 2 (2'). It is noted that the present invention is not limited to such construction and symmetry. The resistance $R_{SET}$ of the SET-state of the resistor 2 (2') is given by $R_{SET} = \rho_{cryst} \cdot L_R / A_C$. In the RESET state the resistor 2 (2') has a resistance $R_{RESET} = (\rho_{cryst} \cdot (L_R - L_S) + \rho_{amorf} \cdot L_S) / A_C$. The dynamic resistance or switchable resistance $R_{dyn}$, defined as $R_{RESET} - R_{SET}$, is given by $R_{dyn} = (\rho_{amorph} - \rho_{cryst}) \cdot L_S / A_C$. Thus, $R_{RESET}$ could be predetermined independently from $R_{SET}$ if $L_S$ could be controlled independently from $L_R$.

In a prior art device as depicted in FIG. 1, the length $L_S$ of the switching zone 12 is dependent on the applied switching power for heating and the thermal properties of the surroundings of the resistor 2 providing cooling. It has been established by the inventors that lowering of the switching power in order to reduce $L_S$ is unreliable, i.e. a considerable spread in the resistance of the RESET state is found upon repeated switching. For reliable switching, the power needs to be increased so that the switching zone has maximum length within the length $L_R$ of the resistor 2. In that case the positions of the boundary surfaces 14 and 16 are determined by the dominating cooling properties of electrical contacts 4 and 6 and to a lesser extent their direct surroundings depending on the presence of further contacting materials. These contacts 4 and 6 serve as heat sinks for heat generated in the portions 20 and 22 of the resistor 2, efficiently cooling these portions and fixing the boundary surfaces 14 and 16 at a distance from each contact surface 8 and 10, respectively. However, therewith, the resistance of the RESET state is coupled to that of the SET state, preventing their independent adjustment.

The present invention enables to overcome this problem by employing a specific design and construction of the nearby surroundings of the resistor 2 in order to reposition at least one of the cross-sectional boundary surfaces 14 and 16 along the length direction of the resistor such that $L_S$ is reduced from its maximum value.

In both devices shown in FIGS. 1 and 2, the nearby surrounding of the resistor 2 (2') is represented by a body 24 (24') encapsulating the resistor. In the length direction, the body 24 (24') extends between the first 8 (8') and second 10 (10') contact areas. Perpendicular to this direction the body 24 (24') extends from the surface of the resistor over a distances d. The inner boundary surface of the body 24 (24') coincides with the outer surfaces of the resistor 2 (2') and the outer boundary surfaces of the body is indicated by the dashed lines.

Referring first to FIG. 1, heat generated within the switching zone 12 at a distance from either cross sectional boundary surface 14 or 16, is transported to the body 24. It is known by those skilled in the art that the distance heat travels into the body 24 during a time t, measured from the beginning of a heating event, is referred to as the "heat penetration depth". This depth is proportional to sqrt(t·k/C), wherein k is the thermal conductivity and C is the specific heat capacity of the body 24. All parts of the body 24 that are located within the range of the heat penetration depth are in thermal contact with the resistor 2 during the time t, and contribute to cooling of the resistor during the time t.

The crux of the present invention is that the body 24 is constructed such that it provides different cooling at different positions along the resistor 2. FIG. 2 shows an embodiment of a device according to the present invention which has a body 24' exemplifying such a structure. This body 24' comprises a first region 26' and a second region 28' arranged such that they define a mutual first contact surface 32' extending between them. A first portion 34' of this surface has an angle of inclination $\alpha_1$ with respect to the length direction. The first portion 34' is substantially not parallel to the nearest surface of the resistor. Moreover, the first region 26' and the second region 28' have materials compositions such that their thermal conductivity and/or specific heat capacity differ such that the regions 26' and 28' provide different thermal insulation. Therefore, within this body 24' the thermally insulating properties alter substantially abruptly upon crossing the first portion 34' when traversing the body 24' along the length direction. An exemplary traversing route is represented by the arrow 36'. The described structure of the body 24' generates a "thermal contrast".

The thermal contrast substantially influences the temperature distribution within the resistor 2' along the length direction during a heating event. Presuming for example that region 26' has better thermally insulating properties than region 28', the part of the resistor located nearest to the region 26' will become hotter than the part nearest to the region 28' during a switching event. Consequently, upon application of an appropriate switching signal, the switching zone 12' is located alongside region 26'. Thus, the cross-sectional boundary surface 16' has shifted when compared to the cross sectional boundary surface 16 present within the resistor 2 of a device lacking the specially designed and constructed body 24'.

The invention enables to decrease $L_S$ to $L_S'$, independently from $L_R$. Therewith, the resistance of the RESET state can be controlled independently from that of the SET state. Furthermore, this can be done without cumbersome adaptation of the materials composition of the phase change material in order to independently tune the resistivities of the different phases. Such adjustments are generally very complicated, because other materials properties need to be tuned simultaneously. Moreover, the power necessary during operation can still be conveniently adjusted through $A_C$ and/or adjustment of both resistivities through, for example, mixing or doping of the phase change material with for example nitrogen, oxygen or other elements.

In practice, a cross-sectional boundary surface 14 (14') or 16 (16') represents a transition region with a finite thickness $\Delta L$, wherein the phase change material changes from amorphous to crystalline or vice versa. This thickness is smaller when the thermal contrast is more abrupt or sharper, such that the temperature distribution within the transition region along the length direction is steeper. Therefore, the better or sharper the thermal contrast within the body 24', the more precise the position of the cross-sectional boundary surface 16' is defined and the less sensitive this position is towards the absolute temperatures reached during a heating event. Therefore, a sharp thermal contrast is preferred as it enhances device operating reliability.

A first option to tailor or tune the thermal contrast is by adjusting the geometric structure of the body 24'. In FIGS. 3, 4 and 5 a number of schematic embodiments of a device according to the present invention are shown. Note that these are cross sections along the length direction which are two dimensional representations. Preferably, in three dimensions, the resistor and its body according to the present invention are symmetrical around its length. However, this does not need to be the case. The body may for example comprise the thermal contrast on one side of the resistor, while on another side it is absent. This could for example facilitate manufacturing. Alternatively, the other side of the body could fulfill other functions, such as to reduce power, or mechanically strengthen the device.

Figure 3A:
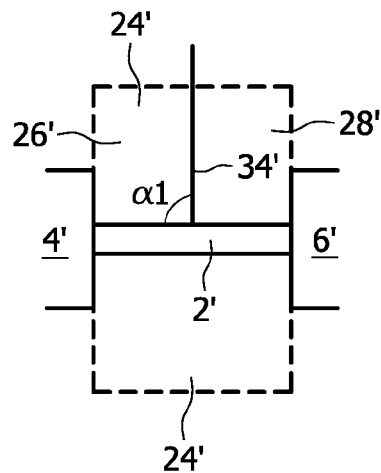
Figure 3B:
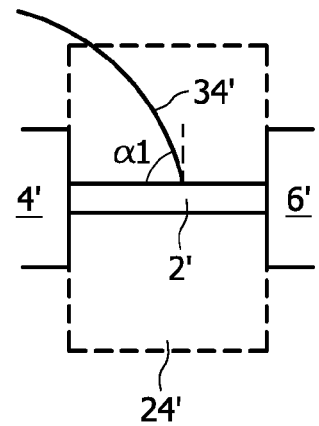
Figure 3C:
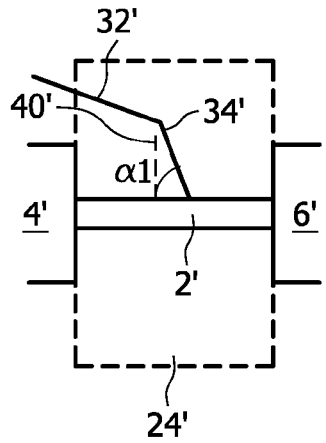
Figure 3D:
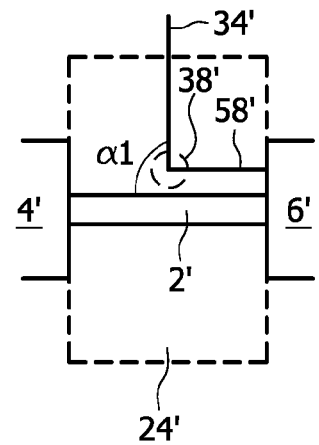
Figure 3E:
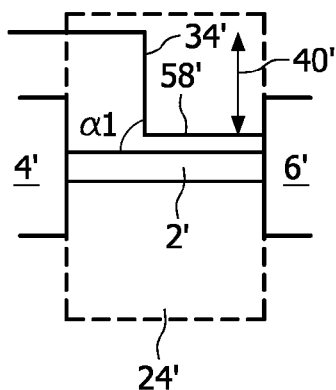

In FIGS. 3A to 3C, the thermal contrast provided by the portion 34' of the contact surface is in direct contact with the nearest surface of the resistor 2'. This is preferred since then the effect of the thermal contrast is enhanced. Alternatively, when needed, the thermal contrast is located within the body at a distance from the resistor as shown in FIG. 3D or 3E. Preferably, the thermal contrast is as close as possible to the nearest surface of the resistor. This saves space. Furthermore, when the heating time or switching time t becomes smaller, heat penetrates less deep into a medium. Hence, the thermal contrast needs to be closer to the nearest resistor surface when switching speed is to be increased.

In an embodiment with an enhanced thermal contrast, the angle of inclination α1 of the first portion 34' with respect to the length direction of the resistor 2', preferably has a value between 60° and 120°. For a particularly sharp contrast it is 90° as depicted in FIG. 3A, 3E or 3D.

The shape of the first portion 34' of the first contact surface 32' can also be tuned. The first portion 34' may comprises a flat surface for an enhanced contrast. Preferably it is entirely flat as shown in FIGS. 3A, 3C, 3D and 3E. Alternatively, the first portion 34' is curved as in FIG. 3B. In that case curvature towards the region having the better thermally isolating properties may be preferred for enhanced contrast and/or heat energy confinement, resulting in lower power usage.

Figure 3F:
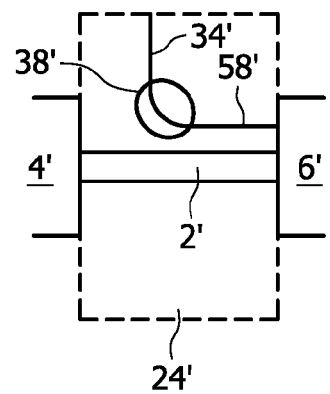

For an enhanced thermal contrast it is beneficial that the corners 38' where the first portion 34' and some other surface meet, are sharp, as for example in FIG. 3D and not rounded, as in FIG. 3F. Such other surfaces, for example, include the nearest resistor surface 18', or other portions of the first contact surface, such as 58'.

The first portion 34' may extend through the entire body 24' as in FIGS. 3A, 3B, 3D and 3F. Alternatively it may extend over part of the body 24', such as shown in FIGS. 3C and 3E. In that case, the width 40' over which it extends perpendicularly to the length direction is important. Although it is difficult to provide a theoretical minimum for this width, it must be large enough for the thermal contrast to exert an effect on the temperature distribution in the resistor. Note that, when the width 40' is zero, no thermal contrast exists at all. With the two regions 26' and 28' on either side of the contact surface 32', the width 40' does not need to be larger than the shortest heat penetration depth, which occurs within the region having the best thermally isolating properties.

FIG. 4 schematically shows a number of embodiments comprising a second contact surface 42', which all include a second portion 44' having a second angle of inclination α2 with respect to the length direction. The second portion 44' and the second thermal contrast it provides is located at a different position along the length direction than the first portion 34' of the first contact surface 32'. This enables control over the position of a second boundary surface 46' of the switching zone 12'. All features and advantages described for the first contact surface 32' equally apply to the second contact surface 42'. Having two contact surfaces, not only enables control over the length of the switching zone 12', but also over its position along the length of the resistor 2'.

Figure 4A:
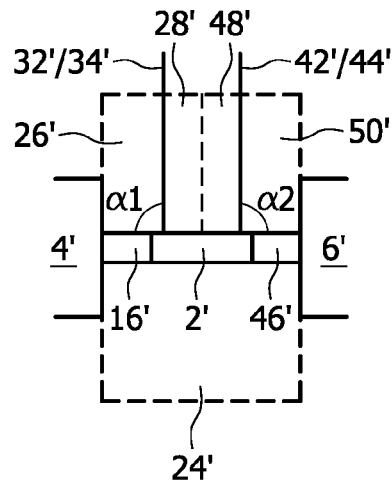
Figure 4B:
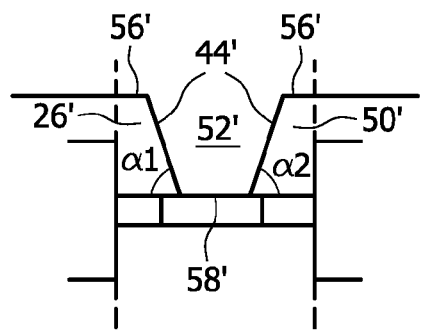
Figure 4C:
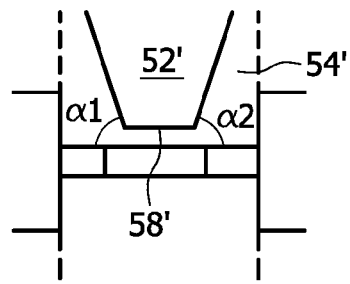
Figure 4D:
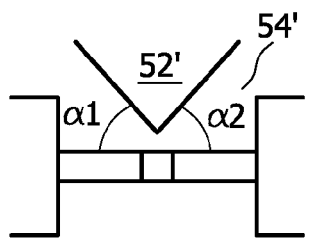
Figure 4E:
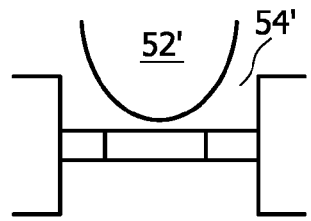
Figure 4F:
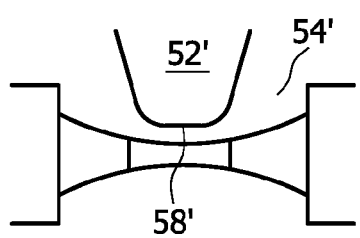
Figure 4G:
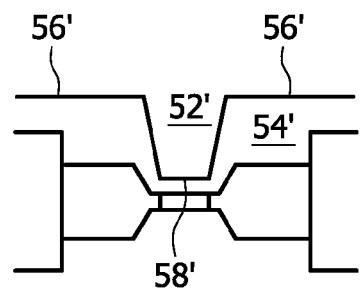

The second contact surface 42' may be formed in between a third region 48' and a fourth region 50', which have materials compositions such that they have different thermal properties. In a device having a thermal contrast as shown in FIG. 4A, all four regions 26', 28', 48' and 50, may have different materials properties such that they have different thermally insulating properties. Alternatively, as shown in FIGS. 4B, 4C, 4D, 4E, 4F, and 4G, the regions 28' and 48' may have the same materials composition such that they become one combined region 52'. In the device of FIG. 4B the regions 26' and 50' may be different. Preferably, the regions 26' and 50' are the same, forming a single combined region 54', such that the combined region 52' forms a protrusion into the combined region 54'. This is for example shown in FIGS. 4C, 4D, 4E, 4F and 4G. The embodiments with combined regions require less manufacturing steps.

As shown in FIGS. 4A, 4B, 4C, 4D, 4F and 4G, a contact surface 32' and/or 42' within a body 24' has a further portion 56' and/or 58', which is oriented substantially parallel to a nearest surface of the resistor 2'. Such a portion 56' and/or 58' will not generate a thermal contrast. However, it will induce a smooth temperature distribution within those parts of the resistor that are nearest to it. This reduces unwanted temperature deviations and enhances device operating reliability and lifetime.

For example, portion 58' is located alongside a switching zone 12'. Therewith it reduces the amount of hotspots in this zone. A hotspot could disrupt the dynamics of crystallization during switching to the SET state if the temperature, reached at such a hotspot, would become higher than the melting temperature. A further advantage relates to switching speed when so called "fast growth" phase change materials are used as described in WO 2004/057684 A1. In this class of materials, crystallization of amorphous phase change material occurs through growth of phase change material crystals present at a boundary surface of the switching zone 12'. During crystallization, these boundary surfaces displace through the switching zone 12'. It is preferred that this displacement occurs in a controlled way to enhance reliability and life span of the device. On the other hand, when so called nucleation growth phase change materials are used, such as for example described in U.S. Pat. No. 5,933,365, hotspots may be desired to induce seeds for crystallization. In that case, the parallel portion 58' of the contact surface does not need to be present along the switching zone. Moreover, the contact surface could even comprise a rough or spiked portion.

In FIG. 5 a number of embodiments of a device comprising an auxiliary region 60' is shown. This auxiliary region 60' physically separates the resistor 2', at least partly, from the body 24'. It may serve a number of purposes. Firstly, it may promote or improve adhesion between the materials on of the resistor 2' and parts of the body 24'. Secondly, it may protect the resistor 2' from contamination with materials components present in the body 24' and/or vice versa. Thirdly, it may form a barrier layer reducing out-diffusion or out-gassing of (vital) materials components of the resistor 2' during operation. Switching of the phase change material typically occurs at high temperatures of around 600 degrees Celsius and one or more elements present in phase change materials may be prone to out-diffusion or out-gassing at such temperatures Fourthly, the auxiliary region 60' may mechanically support the resistor 2'. Especially the latter two functions are advantageous when one of the contrasting regions 26', 28', 48', 50', 52, or 54' comprises a gas or vacuum.

The auxiliary region has a thickness perpendicular to the length direction, which preferably is as small as possible with regard to the optimum thermal contrast, but which is large enough to fulfill the requirements described for example above. Its thickness may for example be <50 nm, <30 nm, <20 nm, <10 nm, <5 nm or <1 nm.

In an embodiment of the device, the resistor has a smallest cross section perpendicular to its length direction such that the smallest cross sectional dimension is smaller than the length of the resistor. In case the resistors cross section is rectangular, the smallest cross sectional dimension is that of the shortest side of this cross section. Alternatively, when its cross section is substantially round, oval, or circular, its smallest cross sectional dimension is the smallest radius.

In this embodiment, the switching zone 12, when no contrast would be present within the body 24, has a lateral boundary surface 18 which is larger than the total area of its cross sectional boundary surfaces 14 and 16. Hence, during a switching or heating event, the portion of heat flowing through the lateral boundary surface 18 into the body 24 is higher than that flowing through the cross sectional boundary surfaces 14 and 16. Thus, the effectiveness of the thermal contrast is increased. The smallest cross sectional dimension may be for example 5 or 10 times smaller than the length of the resistor. Preferably it is 100 times smaller. Alternatively, the cross sectional boundary surfaces may be smaller than 1 time, 2 times, 5 times, 10 times or 50 times the lateral boundary surface.

In an embodiment, the resistor 2' comprises a nanowire. A nanowire generally has a relatively large length and a small cross sectional dimension. Therewith, according to the above described reasons, a thermal contrast can be particularly effective. Furthermore, its relatively large length, provides the space for accommodating more than two thermal contrast surfaces. Moreover, due to its small cross sectional diameter, a cross sectional boundary surfaces is relatively thin. The switching zone is thus relatively precisely defined. Also, its dimensions result in a small switching zone, which requires reduced switching power. Nanowires such as described in the non-prepublished application PCT/IB2005/052729 may be used. They may also be incorporated in a device as described.

A second option to enhance the thermal contrast is by materials choice. For enhanced contrast, the materials within two regions, such as for example 26' and 28' or 48' and 50' or 52' and 54' which form a mutual contact surface, preferably have an increased difference between their thermal conductivity and/or specific heat capacity or other thermal properties. To this end, those skilled in the art will be able to choose combinations of materials known in the art having for example suitable thermal conductivity and/or specific heat capacity.

The product of thermal conductivity and specific heat capacity of one region of a thermal contrast may be larger than 2 times, 5 times, 10 times, 50 times, 100 times or 1000 times that of the other region forming the contrast. Alternatively, the thermal conductivity of one region of a thermal contrast is larger than 2 times, 5 times, 10 times, 50 times or 100 times that of the other region forming the contrast.

A variety of materials and their thermal properties are known in the art. They may be found for example in Thermal Management Handbook for Electronic Assemblies; McGraw Hill; ISBN 0070266999, or CRC Materials Science and Engineering Handbook; CRC Press; ISBN 0-8493-2696-6, or in Microelectronic Engineering 70 (2003), 280-284. Those skilled in the art will be able to choose suitable combinations of materials for creating and manufacturing a thermal contrast according to the requirements described above. Measurement of the thermal properties may be found in for example Journal of Applied Physics 81 (1997), 2590 or Journal of Applied Physics 85 (1999), 7130.

For example, suitable materials for the body regions may be inorganic and organic substances, or mixtures of the two. A first group includes materials such as oxides, nitrides, oxynitrides, carbonitrites, fluorides, sulphides, chlorides, carbides, borides, phosphides and mixtures thereof. A second group includes metals, exemplified by for example: Tantalum, Tungsten, Aluminum, Copper, Carbon or doped Polysilicon. Also alloys of metals may be used, such as for example: TiW, TiN, TaSiN, TiSiN, TiAlC or NiSi. Yet a third group of materials is represented by semiconductors, pure or in doped form.

Materials of the second group generally posses thermal properties for good cooling. Therewith they provide suitable contrast forming materials in combination with for example materials of the first group, which generally have thermally insulating properties. However, the materials of the second group also conduct electrical current relatively well and their use has the risk of electrical leakage or even electrical short circuit between the resistors contacts. Therefore, the regions comprising these metals are preferably not in contact with the resistor. Furthermore, the electrical potential of these regions may be kept the same as the nearest electrical contact to the resistor. Furthermore, the use of metals may result in loss of heating power, due to cooling.

An enhanced thermal contrast with enhanced overall thermal insulation may be created using materials from the first group within one region while those of the neighboring region comprises similar materials including one or more voids. Thus, the neighboring region may comprise a porous material such as for example described in WO 2004/034482 A2. Alternatively it may comprise one or more larger voids. Preferably it consists entirely of a void. Preferably the voids are vacuum, but alternatively they may comprise a gas or liquid. The manufacture of voids is for example described in an article by Gosset et al, in IITC 2003, 6th IEEE International Interconnects Conference, 2003. Nano-laminates having ultra-low thermal conductivity of around 0.6 W/mK may also be employed. Examples are described in for example Science 303, 2004 page 989-990. Their structure allows direction dependent heat flow control.

The materials of the auxiliary region may be chosen from all materials mentioned above, or their combinations provided that they differ at least from one or more of one of the contrasting regions. Preferably they are chosen from the group including: silicon nitride, germanium nitride, silicon carbide, silicon dioxide, tantalum oxide, hafnium oxide, zirconium oxide, silicon oxinitride, titanium oxicarbide or aluminum oxide. Alternatively, the materials may comprise elements such as sulfur, tellurium. All of these may be used in substantially pure form or mixed or doped with elements such as for example Carbon.

Materials of the resistor including the phase change material preferably are chemically compatible with the materials surrounding the resistor. Preferably they also are mechanically compatibility with the body and/or auxiliary region.

The thermal conductivity of the phase material may be chosen such as to optimize the effect of the thermal contrast. The effect is mainly caused by the body material, because the cross-sectional area of the wire (14,16) is usually much smaller than the lateral boundary surface (18). Hence, heat flow is highest towards the surrounding body of the resistor. The thermal conductivity of the phase change material may be of the same order of magnitude as that of the body, but is preferably smaller than 2 or 3 times the thermal conductivity of the body. More preferably it is smaller than the thermal conductivity of the body. This will also further reduce the overall heat loss and hence switching power. Phase change materials are well known in the art and may be chosen from a large group of materials. Examples are described in U.S. Pat. No. 5,933,365. They may be nucleation growth materials. Preferably they are chosen from a group of fast growth materials as described in WO 2004/057684 A1. Also materials doped with for example nitrogen or oxygen as for example described in Journal of Electronic Material 34, 2005, page 176 may be used.

Electrical contacts may be made of any suitable material according to appropriate methods known in the art.

It is noted that the choice of materials is related to the geometric structure of the regions. For example, the higher the difference between materials thermally insulating properties, the smaller the structure of a body comprising a thermal contrast can be for obtaining a similar effect on the temperature distribution within the resistor. Moreover, decreasing the specific heat and/or the thermal conductivity of all the materials within then body, increases the insulating properties of the regions, thereby slowing down the rate of heat loss from the switching zone. This results in more efficient use of heat energy and associated lower power usage of a device during operation. Therefore, the combined tuning of materials and structure of the body is preferred.

Manufacturing of a device according to the present invention, including deposition of materials, patterning of their layers or other treatments can be performed according to standard procedures as known to those skilled in the art and for example described in the references provided in this application.

Figure 5A:
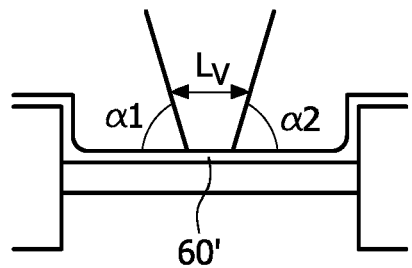
Figure 5B:
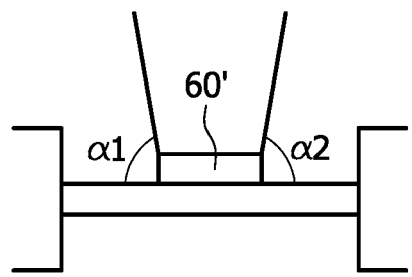
Figure 5C:
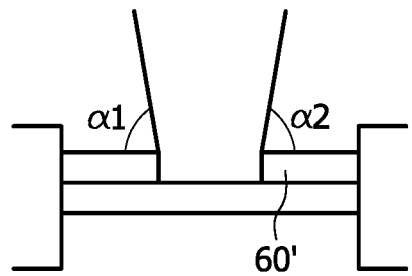
Figure 5D:
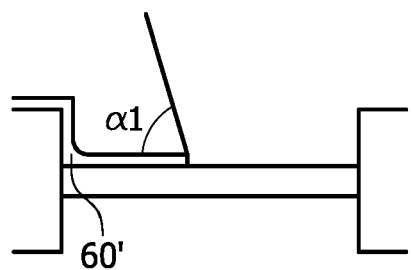

To illustrate the effect of a thermal contrast according to the invention on the switching zone, temperatures profiles within a phase change resistor along the length direction L, during a switching event, were calculated. The resistor was entirely made of phase change material having a thermal conductivity of $\lambda=3.2$ W/mK. The resistor had a width of 20 nm, a height of 20 nm and a length $L_R$ of 200 nm. The thermal contrast is provided by a body as shown in FIG. 5A. The protrusion of region 52' is centered around the center of the length of the resistor. Both $\alpha 1$ and $\alpha 2$ are 90°, region 52' is a void filled with air having $\lambda=0.03$ W/mK and region 54' consists of $SiO_2$ having $\lambda=1.4$ W/mK. A 5 nm thick $SiO_2$ auxiliary region 60' surrounds the entire resistor. The void extends perpendicular to the length direction over a distance of at least 60 nm.

Figure 6:
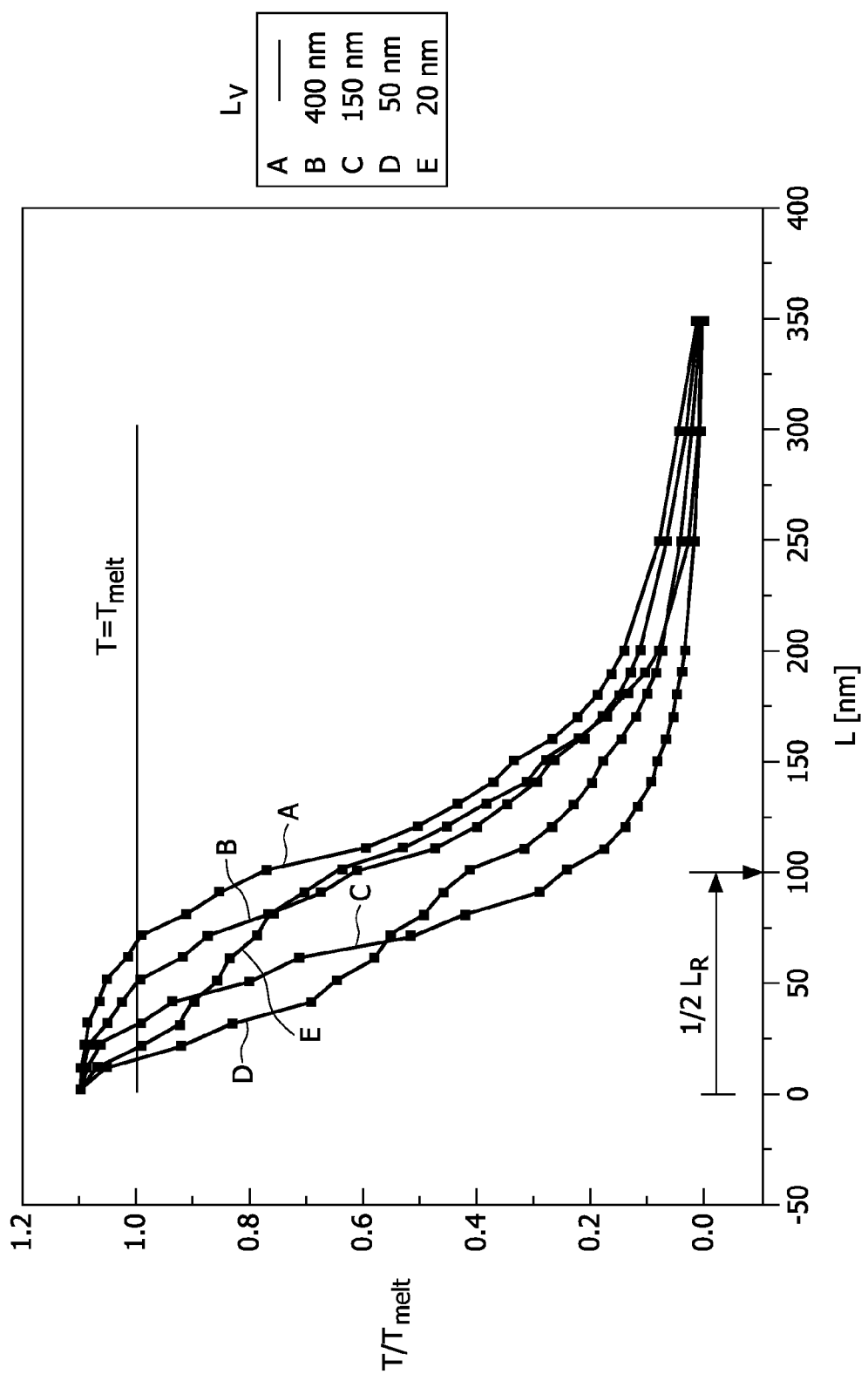
FIG. 6 shows calculated temperature profiles within a resistor along its length direction, the resistor having a body including a void filled with air according to the invention.
Figure 7:
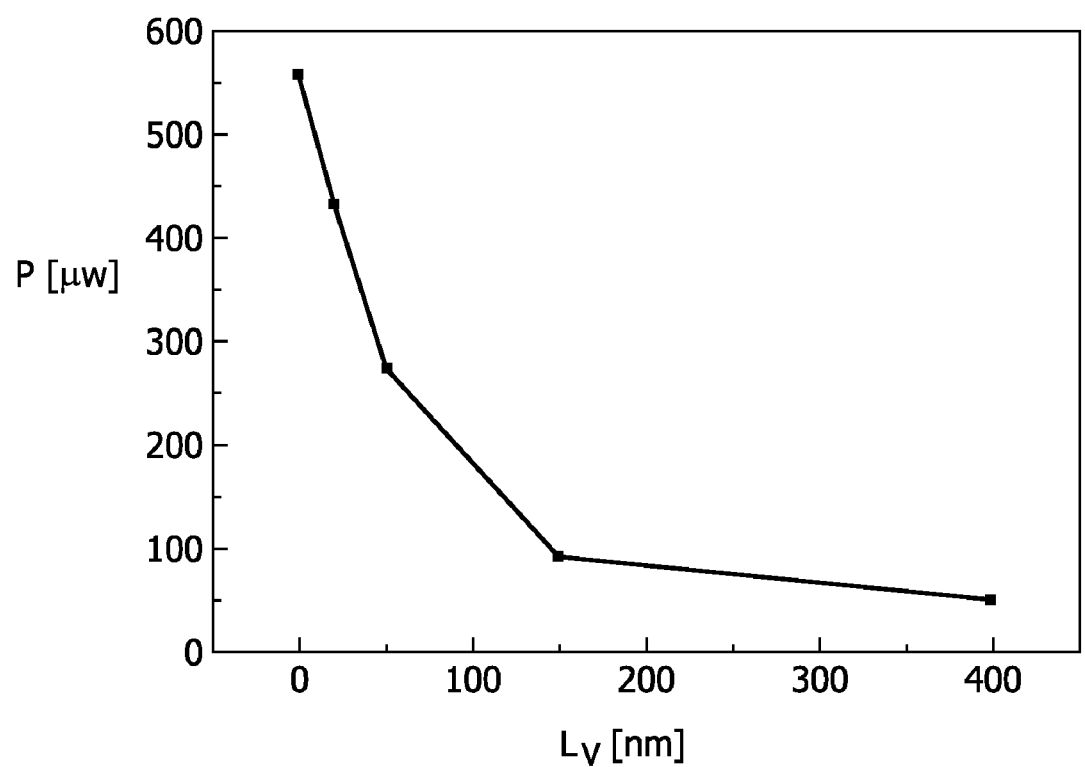
FIG. 7 shows the calculated RESET power of the resistors of FIG. 7 as a function of air gap length.

The results for voids with different length $L_V$ are shown in FIG. 6 by the profiles B to E. For comparison, the result for the resistor lacking a void is shown with profile A. Since the resistor is symmetric in the length direction, only half of the temperature profile is shown. The origin coincides with the center of the resistor and the arrow marks the end of the resistor. From the crossing points of the horizontal line at $T_{melt}$ and the temperature profiles, which mark half the length $L_S$ of a switching zone, it is evident that the $L_S$ and thus the dynamic resistance $R_{dyn}$ as described earlier, can be set with the length $L_V$ without altering $L_R$. The increasing steepness of the temperature profiles A to E caused by the thermal contrast is evident from the tangent lines to these profiles around the crossing points. The control of the dynamic resistance is accompanied by an advantageous reduction of switching power. The calculated switching power P required for the described resistors is shown in FIG. 7. For a void in $SiO_2$, which has a length $L_V$ in between 50 and 150 nm, surrounding a 200 nm long resistor, the switching reliability is increased and the switching power is reduced by a factor of around 2 to 5.

In an embodiment the resistor is constructed parallel to a substrate surface with a shape as described in for example WO 2004/057618 A2 and WO 2005/041196. Such devices are referred to as horizontal devices. FIG. 8 shows a vertical cross section of a device according to the present invention comprising such a horizontal resistor 70, encapsulated by an auxiliary region 71, on top of a transistor 72 in substrate 73 with a surface 75, the transistor having a source 74, a drain 76 and a gate 78. The resistor 70 is electrically connected to the drain 76 through plug 80, metal-1 layer 82, via 84 and metal-2 layer 86. The switching zone 88 is confined on two sides by the inclined portions 90 of the contact surface 92 formed between the contrast regions 94 and 96 creating a body structure similar to that shown in for example FIG. 5A. Viewed from top, the resistor 70 may comprise a constriction along the length direction (not shown). as for example shown in FIG. 4G. Preferably, the region 96 is $SiO_2$, while region 94 is a void which is vacuum or filled with a thermally isolating, inert gas.

Alternatively, as exemplified in FIG. 9, a vertical device may be prepared, wherein the resistor 170 is arranged such that the length direction is perpendicular to the surface 175 of the substrate 173. Like parts of FIGS. 8 and 9 have like numerals. The resistor 170 is manufactured in a via between metal-1 layer 182 and metal-2 layer 186. It is electrically connected to the drain 176, of transistor 172, through plug 180 and layer 182. The resistor 170 is vertically surrounded by an auxiliary region 171, manufactured as a spacer. The thermal contrast is formed between region 194 and 196 of which the former has better thermally insulating properties. Their mutual contact surface 190 confines the switching zone 188 on one side. The resistor 170 may for example be formed by a phase change nanowire grown in a hole.

Those skilled in the art will be able to design other arrangements and positions of the device according to the invention within the plurality of layers of an integrated circuit according to need. They will also know how to manufactured such devices using production methods and materials known in the art.

Devices according to the present invention may be used as an electrical memory apparatus. An electrical connectivity scheme of an array 200 of memory cells 202 within such an apparatus is shown in FIG. 10. Herein each memory cell comprises a series connection of a memory elements 204, and a selection transistor 206 and is connected between a grid of conductive lines 208 and 210 Addressing lines 212 are connected to the gates of the transistors 206. Such a scheme permits that the information written in each discrete memory element 204 can be read and written without disturbing information stored in adjacent or remote memory cells of the array. Peripheral circuitry (not shown) for operating the memory array is designed and connected to the gridlines 208 and 210 according to methods known in the art.

Generally, the present invention is not limited to the use of any specific type of connectivity scheme or selection device. Examples of selection devices include field-effect transistors, bipolar junction transistors or diodes. Examples of field effect transistors include JFET and metal oxide semiconductor field-effect transistors (MOSFET). Examples of MOSFET include NMOS transistors, and PMOS transistors. Furthermore NMOS and PMOS transistors may even be formed on the same chip for CMOS technologies.

FIG. 11 shows an electrical connectivity scheme of an apparatus 300 comprising electrical subunits 302 and 304. These subunits can be electrically connected and disconnected through switching of a device 306 according to the present invention. The switch 306 may be operated with the transistor 308. The subunits may be anything in between single electrical elements or components, such as for example transistors and complete functional logic blocks within an IC.

It should be noted that the above-mentioned embodiments illustrate rather than limit the invention, and at that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that the combination of these measures cannot be used to advantage.

The invention claimed is:

1. An electric device comprising an electrically switchable resistor comprising:
   a phase change material, the resistor being electrically connected to a first and second electrical contact via a first and second contact area,
   the resistor extending between the first and second contact area and having a length, defined as the distance between the first and second contact area measured along the resistor,
   the device further comprising,
   a body located around the resistor between the first and second contact area, the body being in thermal contact with the resistor, wherein, along the resistor in the direction of its length and between the first contact area and the second contact area
   the body successively comprises a first region and a second region, the first and second regions defining a first contact surface extending between the first and the second region,
   the contact surface comprising a first portion which has a first angle of inclination with respect to the length direction of the resistor,
   the first region having a first material composition, and the second region having a second material composition different from the first material composition, such that the first and second regions have mutually different thermally insulating properties;
   wherein, along the resistor in its length direction and in between the first and second contact area, the body further comprises a third region and a fourth region,
   the third and fourth regions defining a second contact surface comprising a second portion having a second angle of inclination with respect to the length direction,
   the first and second portions being positioned at different locations along the resistor in its length direction,
   the third region having a third material composition, and the fourth region having a fourth material composition different from the third material composition, such that the third and fourth regions have mutually different thermally insulating properties; and
   wherein the first and fourth regions have the same materials composition and that the second and third regions have the same materials composition.

2. An electric device as claimed in claim 1, wherein at least the first contact surface comprises a further portion which is oriented substantially parallel to the surface of the resistor that is nearest to this further portion.

3. An electric device as claimed in claim 1 wherein, the device comprises an auxiliary region, which is, at least partly, arranged between the body and the resistor.

4. An electric device comprising an electrically switchable resistor comprising:
   a phase change material, the resistor being electrically connected to a first and second electrical contact via a first and second contact area,
   the resistor extending between the first and second contact area and having a length, defined as the distance between the first and second contact area measured along the resistor,
   the device further comprising,
   a body located around the resistor between the first and second contact area, the body being in thermal contact with the resistor, wherein, along the resistor in the direction of its length and between the first contact area and the second contact area,
   the body successively comprises a first region and a second region, the first and second regions defining a first contact surface extending between the first and the second region,
   the contact surface comprising a first portion which has a first angle of inclination with respect to the length direction of the resistor,
   the first region having a first material composition, and the second region having a second material composition different from the first material composition, such that the first and second regions have mutually different thermally insulating properties;
   wherein, along the resistor in its length direction and in between the first and second contact area, the body further comprises a third region and a fourth region,
   the third and fourth regions defining a second contact surface comprising a second portion having a second angle of inclination with respect to the length direction,
   the first and second portions being positioned at different locations along the resistor in its length direction,
   the third region having a third material composition, and the fourth region having a fourth material composition different from the third material composition, such that the third and fourth regions have mutually different thermally insulating properties; and
   wherein, the resistor comprises a nanowire.

5. An electric device as claimed in claim 1 wherein, the device comprises a substrate having a surface, the resistor being arranged relative to this surface such that the length direction of the resistor is substantially perpendicular to this surface.

6. An electric device as claimed in claim 1 wherein, at least one of the first and second regions comprises a gas or vacuum.

7. An electric device as claimed in claim 1 wherein, the first and second material compositions have a first and second thermal conductivities, respectively and that the first or the second thermal conductivity is at least 20 times higher than the other.

8. An electrical apparatus comprising electrical subunits and at least one electrical device as claimed in claim 1, wherein the electrical device is arranged as a switch for electrically connecting and disconnecting the electrical subunits.

* * * * *